United States Patent
Liao et al.

(10) Patent No.: US 9,430,957 B2
(45) Date of Patent: Aug. 30, 2016

(54) VIRTUAL LOAD BOARD AND TEST SYSTEM AND TEST METHOD FOR LIQUID CRYSTAL DISPLAY CONTROL BOARD

(75) Inventors: Shiue-shih Liao, Shenzhen (CN); Chun-jiang Li, Shenzhen (CN); Xiao-xin Zhang, Shenzhen (CN); Jung-mao Tsai, Shenzhen (CN)

(73) Assignee: SHENZHEN CHINA STAR OPTOELECTRONICS TECHNOLOGY CO., LTD., Shenzhen, Guangdong Province (CN)

( * ) Notice: Subject to any disclaimer, the term of this patent is extended or adjusted under 35 U.S.C. 154(b) by 1132 days.

(21) Appl. No.: 13/379,349

(22) PCT Filed: Oct. 18, 2011

(86) PCT No.: PCT/CN2011/080905
§ 371 (c)(1),
(2), (4) Date: Dec. 19, 2011

(87) PCT Pub. No.: WO2013/044536
PCT Pub. Date: Apr. 4, 2013

(65) Prior Publication Data
US 2013/0076386 A1    Mar. 28, 2013

(30) Foreign Application Priority Data

Sep. 28, 2011 (CN) .................. 2011 1 03021858

(51) Int. Cl.
*G01R 31/26* (2014.01)
*G09G 3/00* (2006.01)
*G01R 31/28* (2006.01)
*G09G 3/36* (2006.01)

(52) U.S. Cl.
CPC .......... *G09G 3/006* (2013.01); *G01R 31/2849* (2013.01); *G09G 3/3611* (2013.01)

(58) Field of Classification Search
CPC ................. G09G 3/006; G02F 2001/136254; G01R 31/26
See application file for complete search history.

(56) References Cited

U.S. PATENT DOCUMENTS

| 4,145,651 A * | 3/1979 | Ripingill, Jr. ................ 324/72.5 |
| 5,572,143 A * | 11/1996 | Myers et al. ................ 324/555 |
| 6,766,266 B1 * | 7/2004 | Sakaguchi .................... 702/117 |

(Continued)

FOREIGN PATENT DOCUMENTS

| CN | 2909315 Y | 6/2007 |
| CN | 101950516 A | 1/2011 |

*Primary Examiner* — Tung X Nguyen
*Assistant Examiner* — Adam Clarke
(74) *Attorney, Agent, or Firm* — Cheng-Ju Chiang

(57) ABSTRACT

A virtual load board includes a connection port, a conversion circuit, and an indication unit, wherein the connection port comprises at least one terminal. The terminal receives an output voltage from the liquid crystal display control board. The conversion circuit converts the output voltage into an operating voltage for the indication unit and supplies the operating voltage to the indication unit. A test system and a test method for liquid crystal display control board are also provided. With the above-discussed arrangement, the virtual load board replaces a liquid crystal display panel to carry out a reliability test of the liquid crystal display control board, and has the advantages of small volume and low cost and can be accommodated, together with the liquid crystal display control board, in reliability test equipment in order to carry out a reliability test of the liquid crystal display control board in a specific environment.

12 Claims, 3 Drawing Sheets

(56) References Cited

U.S. PATENT DOCUMENTS

| | | | |
|---|---|---|---|
| 8,228,072 B2 * | 7/2012 | Hagen | G01R 31/31924 324/555 |
| 2003/0171883 A1 * | 9/2003 | Tseng et al. | 702/64 |
| 2005/0122297 A1 | 6/2005 | Imagawa et al. | |
| 2006/0022930 A1 | 2/2006 | Chen et al. | |
| 2009/0015572 A1 * | 1/2009 | Matsui | 345/204 |
| 2009/0230885 A1 * | 9/2009 | Tanaka | G09G 3/006 315/297 |
| 2010/0321004 A1 | 12/2010 | Lauks et al. | |
| 2012/0293159 A1 * | 11/2012 | Huang | G01R 19/16576 324/76.11 |

* cited by examiner

VIRTUAL LOAD BOARD AND TEST SYSTEM AND TEST METHOD FOR LIQUID CRYSTAL DISPLAY CONTROL BOARD

BACKGROUND OF THE INVENTION

1. Field of the Invention

The present invention relates to the field of liquid crystal displaying techniques, and in particular to a virtual load board and a test system and a test method for liquid crystal display control board.

2. The Related Arts

Reliability of a product is defined as the probability that the product may successfully complete a task when performing a specific performance or function under specified conditions within a specified period of time. In the process of reliability test for a conventional liquid crystal display control boards, the liquid crystal display board needs to be connected to a liquid crystal display panel and this makes the test equipment bulky in size and high in manufacturing cost and also makes it not fit for being accommodated in the reliability test equipment. Consequently, in the conventional techniques, the reliability test of liquid crystal display control board can only be carried out in a regular environment and it is generally not possible to carry out tests for specific functions in a specific environment and thus it is impossible to identify a reliability problem that might be found by carrying out tests of specific functions in a specific environment.

Thus, it is desired to have a virtual load board and a test system and a test method for liquid crystal display control board to overcome the above problems.

SUMMARY OF THE INVENTION

The technical issue to be primarily addressed by the present invention is to provide a virtual load board and a test system and a test method for liquid crystal display control board, for substitute for a liquid crystal display panel in carrying out a reliability test of a liquid crystal display control board.

To address the above technical issue, the present invention adopts a technical solution that provides a virtual load board, which comprises: a connection port, a conversion circuit, and an indication unit, wherein the connection port comprises at least one terminal. The terminal receives an output voltage from a liquid crystal display control board. The conversion circuit converts the output voltage into an operating voltage for the indication unit and supplies the operating voltage to the indication unit.

Wherein, the conversion circuit comprises a first resistor component and a second resistor component connected in series between the terminal and a reference voltage.

Wherein, the indication unit comprises a light-emitting diode connected in parallel with the first resistor component or the second resistor component.

Wherein, the first resistor component or the second resistor component comprises a plurality of resistors connected in parallel.

Wherein, the conversion circuit further comprises a filter capacitor connected in series between the terminal and the reference voltage.

Wherein, the output voltage comprises high gate voltage, low gate voltage, common voltage, a first operating voltage, or second operating voltage.

To address the above technical issue, the present invention adopts another technical solution that provides a test system for liquid crystal display control board, which comprises a virtual load board. The virtual load board is connected to a liquid crystal display control board in order to monitor operation condition of the liquid crystal display control board with an indication unit, wherein the virtual load board comprises a connection port, a conversion circuit, and the indication unit. The connection port comprises at least one terminal. The terminal receives an output voltage from the liquid crystal display control board. The conversion circuit converts the output voltage into an operating voltage for the indication unit and supplies the operating voltage to the indication unit.

Wherein, the conversion circuit comprises a first resistor component and a second resistor component connected in series between the terminal and a reference voltage.

Wherein, the indication unit comprises a light-emitting diode connected in parallel with the first resistor component or the second resistor component.

Wherein, the first resistor component or the second resistor component comprises a plurality of resistors connected in parallel.

Wherein, the conversion circuit further comprises a filter capacitor connected in series between the terminal and the reference voltage.

Wherein, the output voltage comprises high gate voltage, low gate voltage, common voltage, a first operating voltage, or second operating voltage.

To address the above technical issue, the present invention adopts a further technical solution that provides a test method for liquid crystal display control board, which comprises the following steps: receiving an output voltage from a liquid crystal display control board; converting the output voltage into an operating voltage for an indication unit and supplying the operating voltage to the indication unit; and monitoring operation condition of the liquid crystal display control board with the indication unit.

Wherein, the step of converting the output voltage into an operating voltage for an indication unit and supplying the operating voltage to the indication unit comprises: performing voltage division of the output voltage.

Wherein, the step of converting the output voltage into an operating voltage for an indication unit and supplying the operating voltage to the indication unit comprises: performing filtration of the output voltage.

The efficacy of the present invention is that to be distinguished from the state of the art, the present invention provides a virtual load board and a test system and a test method for liquid crystal display control board, in which the virtual load board may replace a liquid crystal display panel for carrying out a reliability test of the liquid crystal display control board. The virtual load board has the advantages of small volume and low cost and can be accommodated, together with the liquid crystal display control board, in reliability test equipment to carry out a reliability test of the liquid crystal display control board in a specific environment.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Figure 1:
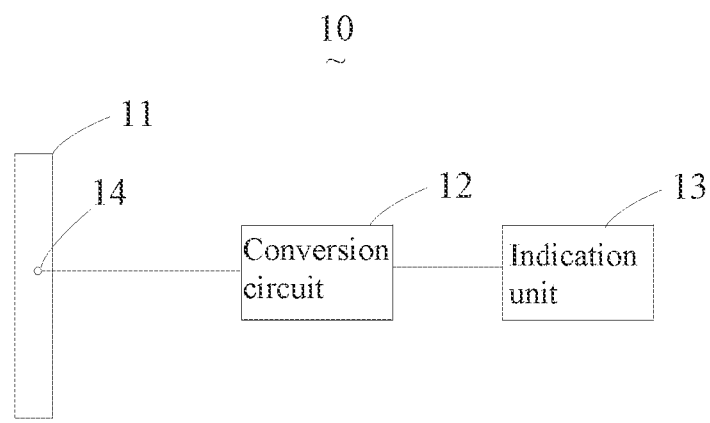
FIG. 1 is a schematic block diagram of a virtual load board according to a first embodiment of the present invention.

Referring to FIG. 1, FIG. 1 is a schematic block diagram of a virtual load board according to a first embodiment of the present invention. As shown in FIG. 1, the virtual load board 10 according to the instant embodiment comprises a connection port 11, a conversion circuit 12, and an indication unit 13. The connection port 11 comprises at least one terminal 14.

In the instant embodiment, the terminal 14 functions to receive an output voltage output from a liquid crystal display control board (not shown). The conversion circuit 12 is connected to the terminal 14 to receive the output voltage. The conversion circuit 12 functions to convert the output voltage into an operating voltage for the indication unit 13 and supplies the operating voltage to the indication unit 13. The indication unit 13 is actuated by the operating voltage to generate an indication signal, and thus indicates the operation condition of the liquid crystal display control board. In the instant embodiment, the conversion circuit 12 can be any voltage conversion circuit known in the art, and the indication unit 13 can be any indication unit known in the art to generate a viewable or a hearable signal.

With the above arrangement, the virtual load board 10 can replace a liquid crystal display panel to carry out a reliability test for the liquid crystal display control board. The virtual load board 10 has the advantages of small volume and low manufacturing cost and can be accommodated, together with the liquid crystal display control board, in reliability test equipment to carry out a reliability test of the liquid crystal display control board in a specific environment.

Figure 2:
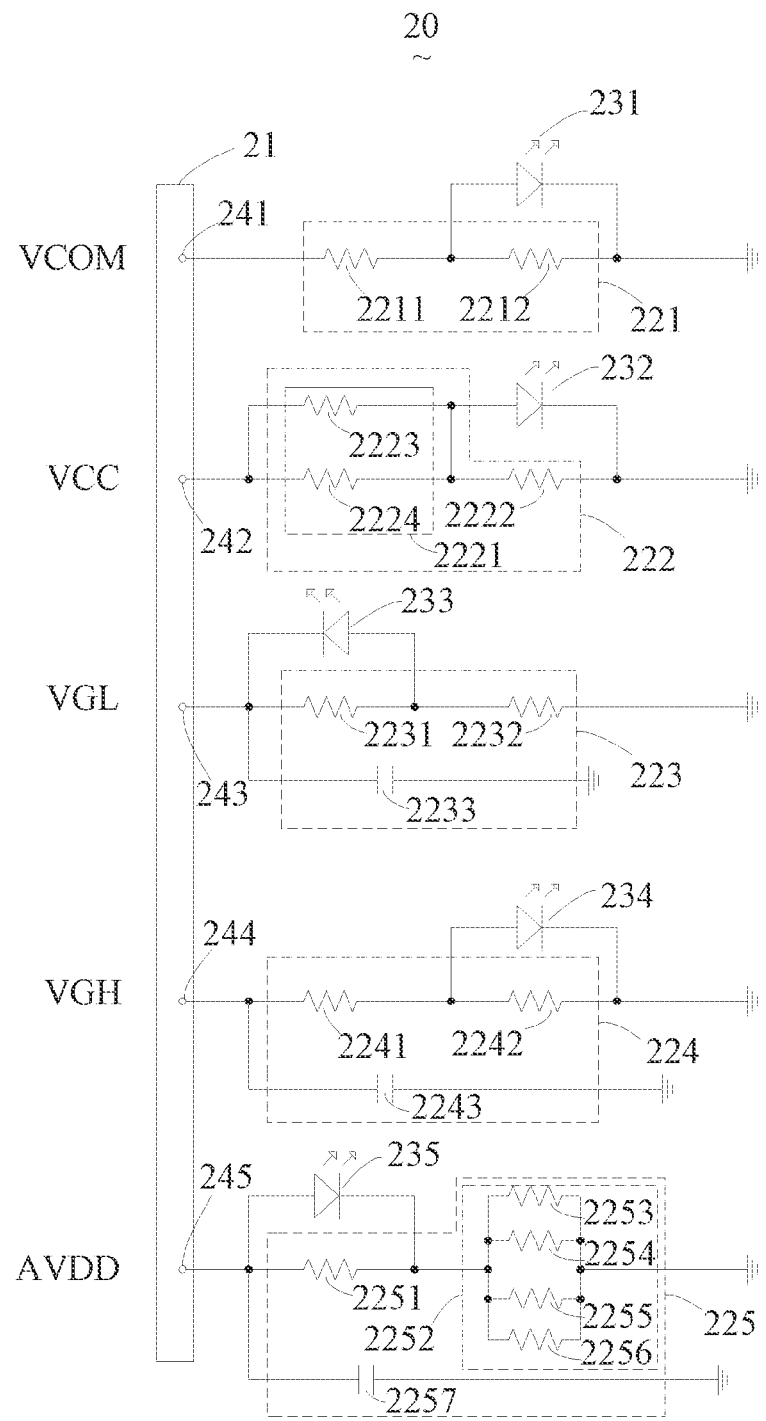
FIG. 2 is a circuit diagram of a virtual load board according to a second embodiment of the present invention.

Referring to FIG. 2, a circuit diagram of a virtual load board according to a second embodiment of the present invention is shown. As shown in FIG. 2, the virtual load board 20 according to the instant embodiment comprises a connection port 21, conversion circuits 221, 222, 223, 224, 225, and indication units 231, 232, 233, 234, 235. In the instant embodiment, the connection port 21 comprises terminals 241, 242, 243, 244, and 245. The terminal 241 functions to receive a common voltage VCOM from the liquid crystal display control board. The terminal 242 functions to receive a first operating voltage VCC from the liquid crystal display control board. The terminal 243 functions to receive a low gate voltage VGL from the liquid crystal display control board. The terminal 244 functions to receive a high gate voltage VGH from the liquid crystal display control board. The terminal 245 functions to receive a second operating voltage AVDD from the liquid crystal display control board.

Specifically, the conversion circuit 221 is connected to the terminal 241 to receive the common voltage VCOM, wherein the conversion circuit 221 comprises a first resistor component 2211 and a second resistor component 2212. In the instant embodiment, the first resistor component 2211 and the second resistor component 2212 are each realized with a single resistor and the first resistor component 2211 and the second resistor component 2212 are connected in series between the terminal 241 and ground voltage. The indication unit 231 is connected in parallel with the second resistor component 2212 of the conversion circuit 221 to receive an operating voltage. In the instant embodiment, the indication unit 231 is a light-emitting diode. The light-emitting diode 231 has a positive terminal connected between the first resistor component 2211 and the second resistor component 2212. The light-emitting diode 231 has a negative terminal connected to ground voltage. When the second resistor component 2212 of the conversion circuit 221 provides a division voltage that meets the operating voltage of the indication unit 231, the indication unit 231 emits light normally to indicate that the common voltage VCOM supplied from the liquid crystal display control board is normal. When the division voltage of the second resistor component 2212 of the conversion circuit 221 does not meet the operating voltage of the indication unit 231, the indication unit 231 does not give off light normally, indicating the common voltage VCOM supplied from the liquid crystal display control board is abnormal.

The conversion circuit 222 is connected to the terminal 242 to receive the first operating voltage VCC, wherein the conversion circuit 222 comprises a first resistor component 2221 and a second resistor component 2222. The first resistor component 2221 and the second resistor component 2222 are connected in series between the terminal 242 and ground voltage. In the instant embodiment, the first resistor component 2221 is realized with a resistor 2223 and a resistor 2224 that are connected in parallel, and the second resistor component 2222 is realized with a single resistor. The indication unit 232 is connected in parallel with the second resistor component 2222 of the conversion circuit 222 to receive an operating voltage. In the instant embodiment, the indication unit 232 is a light-emitting diode. The light-emitting diode 232 has a positive terminal connected between the first resistor component 2221 and the second resistor component 2222. The light-emitting diode 232 has a negative terminal connected to ground voltage. When the second resistor component 2222 of the conversion circuit 222 provides a division voltage that meets the operating voltage of the indication unit 232, the indication unit 232 emits light normally to indicate that the first operating voltage VCC supplied from the liquid crystal display control board is normal. When the division voltage of the second resistor component 2222 of the conversion circuit 222 does not meet the operating voltage of the indication unit 232, the indication unit 232 does not give off light normally, indicating the first operating voltage VCC supplied from the liquid crystal display control board is abnormal.

The conversion circuit 223 is connected to the terminal 243 to receive the low gate voltage VGL, wherein the conversion circuit 223 comprises a first resistor component 2231 and a second resistor component 2232. In the instant embodiment, the first resistor component 2231 and the second resistor component 2232 are each realized with a single resistor and the first resistor component 2231 and the second resistor component 2232 are connected in series between the terminal 243 and ground voltage. The indication unit 233 is connected in parallel with the first resistor component 2231 of the conversion circuit 223 to receive an operating voltage. In the instant embodiment, the indication unit 233 is a light-emitting diode. Since the low gate voltage VGL is a negative voltage, a positive terminal of the light-emitting diode 233 is connected between the first resistor component 2231 and the second resistor component 2232 and a negative terminal of the light-emitting diode 233 is connected between the terminal 223 and the first resistor component 2231. In addition, the conversion circuit 223 further comprises a filter capacitor 2233 connected in series between the terminal 243 and ground voltage for filtering operation of the low gate voltage VGL. When the first resistor component 2231 of the conversion circuit 223 provides a division voltage that meets the operating voltage of the indication unit 233, the indication unit 233 emits light normally to indicate that the low gate voltage VGL supplied from the liquid crystal display control board is normal. When the division voltage of the first resistor component 2231 of the conversion circuit 223 does not meet the operating voltage of the indication unit 233, the indication unit 233 does not give off light normally, indicating the low gate voltage VGL supplied from the liquid crystal display control board is abnormal.

The conversion circuit 224 is connected to the terminal 244 to receive the high gate voltage VGH, wherein the conversion circuit 224 comprises a first resistor component 2241 and a second resistor component 2242. In the instant embodiment, the first resistor component 2241 and the second resistor component 2242 are each realized with a single resistor and the first resistor component 2241 and the second resistor component 2242 are connected in series between the terminal 244 and ground voltage. The indication unit 234 is connected in parallel with the second resistor component 2242 of the conversion circuit 224 to receive an operating voltage. In the instant embodiment, the indication unit 234 is a light-emitting diode. The light-emitting diode 234 has a positive terminal connected between the first resistor component 2241 and the second resistor component 2242. The light-emitting diode 234 has a negative terminal connected to ground voltage. In addition, the conversion circuit 224 further comprises a filter capacitor 2243 connected in series between the terminal 244 and ground voltage for filtering operation of the high gate voltage VGH. When the second resistor component 2242 of the conversion circuit 224 provides a division voltage that meets the operating voltage of the indication unit 234, the indication unit 234 emits light normally to indicate that the high gate voltage VGH supplied from the liquid crystal display control board is normal. When the division voltage of the second resistor component 2242 of the conversion circuit 224 does not meet the operating voltage of the indication unit 234, the indication unit 234 does not give off light normally, indicating the high gate voltage VGH supplied from the liquid crystal display control board is abnormal.

The conversion circuit 225 is connected to terminal 245 to receive the second operating voltage AVDD, wherein the conversion circuit 225 comprises a first resistor component 2251 and a second resistor component 2252. The first resistor component 2251 and the second resistor component 2252 are connected in series between the terminal 245 and ground voltage. In the instant embodiment, the second resistor component 2252 is realized with a resistor 2253, a resistor 2254, a resistor 2255, and a resistor 2256 that are connected in parallel and the first resistor component 2251 is realized with a single resistor. The indication unit 235 is connected in parallel with the first resistor component 2251 of the conversion circuit 225 to receive an operating voltage. In the instant embodiment, the indication unit 235 is a light-emitting diode. The light-emitting diode 235 has a positive terminal connected between the terminal 245 and the first resistor component 2251. The light-emitting diode 235 has a negative terminal connected between the first resistor component 2251 and the second resistor component 2252. In addition, the conversion circuit 225 further comprises a filter capacitor 2257 connected in series between the terminal 245 and ground for filtering operation of the second operating voltage AVDD. When the first resistor component 2251 of the conversion circuit 225 provides a division voltage that meets the operating voltage of the indication unit 235, the indication unit 235 emits light normally to indicate that the second operating voltage AVDD supplied from the liquid crystal display control board is normal. When the division voltage of the first resistor component 2251 of the conversion circuit 225 does not meet the operating voltage of the indication unit 235, the indication unit 235 does not give off light normally, indicating the second operating voltage AVDD supplied from the liquid crystal display control board is abnormal.

In the instant embodiment, ground voltage can be replaced by other suitable reference voltage. Under this condition, the resistances of the first resistor component and the second resistor component of the voltage conversion circuit and specific connection relationship between the indication unit and the first resistor component and the second resistor component according to the output voltage supplied from the liquid crystal display control board and the selected reference voltage.

Further, the present invention also provides a test system for liquid crystal display control board. The test system comprises the above-discussed virtual load board, and connects the virtual load board with the liquid crystal display control board for monitoring the operation condition of the liquid crystal display control board with the indication unit. In a preferred embodiment, the virtual load board and the liquid crystal display control board are accommodated together in reliability test equipment to perform a reliability test of the liquid crystal display control board in a specific environment.

Figure 3:
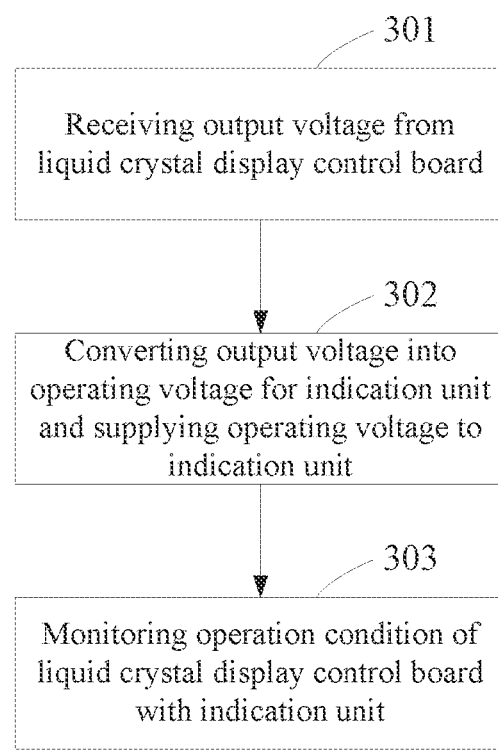
FIG. 3 is a flow chart of a test method for liquid crystal display control board according to an embodiment of the present invention.

Referring to FIG. 3, FIG. 3 is a flow chart of a test method for liquid crystal display control board according to the present invention. The test method for liquid crystal display control board according to an embodiment of the present invention comprises the following steps:

Step 301: receiving an output voltage from a liquid crystal display control board;

Step 302: converting the output voltage into an operating voltage for an indication unit and supplying the operating voltage to the indication unit; and Step 303: monitoring operation condition of the liquid crystal display control board with the indication unit.

In Step 302, voltage division and filtration of the output voltage are further performed to obtain the operating voltage for the indication unit.

In summary, the present invention provides a virtual load board and a test system and a test method for liquid crystal display control board, in which the virtual load board may replace a liquid crystal display panel for carrying out a reliability test of the liquid crystal display control board. The virtual load board has the advantages of small volume and low cost and can be accommodated, together with the liquid crystal display control board, in reliability test equipment to carry out a reliability test of the liquid crystal display control board in a specific environment.

Embodiments of the present invention have been described, but not to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A virtual load board, wherein the virtual load board comprises a connection port, a conversion circuit, and an indication unit, wherein the connection port comprises at least one terminal, the terminal adapted to receive an output voltage from a liquid crystal display control board, the conversion circuit connected to a reference voltage and receiving and converting the output voltage into an operating voltage for the indication unit and supplying the operating voltage to the indication unit;

wherein the conversion circuit comprises a first resistor component and a second resistor component connected in series between the terminal and the reference voltage and the indication unit has a first end directly connected to a node point between the first and second resistor components and a second end connected directly to the terminal or the reference voltage and is connected in parallel with the first resistor component or the second resistor component, which defines a division voltage that is supplied to the indication unit, whereby the indication unit is activated when the division voltage corresponds to the operating voltage of the indication unit.

2. The virtual load board as claimed in claim 1, wherein the indication unit comprises a light-emitting diode connected in parallel with the first resistor component or the second resistor component.

3. The virtual load board as claimed in claim 1, wherein the first resistor component or the second resistor component comprises a plurality of resistors connected in parallel.

4. The virtual load board as claimed in claim 1, wherein the conversion circuit further comprises a filter capacitor connected in series between the terminal and the reference voltage and in parallel with the conversion circuit.

5. The virtual load board as claimed in claim 1, wherein the output voltage comprises high gate voltage, low gate voltage, common voltage, a first operating voltage, or second operating voltage.

6. A test system for a liquid crystal display control board, wherein the test system comprises a virtual load board, the virtual load board adapted to connect to a liquid crystal display control board in order to monitor operation condition of the liquid crystal display control board with an indication unit, wherein the virtual load board comprises a connection port, a conversion circuit, and the indication unit, the connection port comprising at least one terminal, the terminal receiving an output voltage from the liquid crystal display control board, the conversion circuit connected to a reference voltage and receiving and converting the output voltage into an operating voltage for the indication unit and supplying the operating voltage to the indication unit;

wherein the conversion circuit comprises a first resistor component and a second resistor component connected in series between the terminal and the reference voltage and the indication unit has a first end directly connected to a node point between the first and second resistor components and a second end connected directly to the terminal or the reference voltage and is connected in parallel with the first resistor component or the second resistor component, which defines a division voltage that is supplied to the indication unit, whereby the indication unit is activated when the division voltage corresponds to the operating voltage of the indication unit.

7. The test system as claimed in claim 6, wherein the indication unit comprises a light-emitting diode connected in parallel with the first resistor component or the second resistor component.

8. The test system as claimed in claim 6, wherein the first resistor component or the second resistor component comprises a plurality of resistors connected in parallel.

9. The test system as claimed in claim 6, wherein the conversion circuit further comprises a filter capacitor connected in series between the terminal and the reference voltage and in parallel with the conversion circuit.

10. The test system as claimed in claim 6, wherein the output voltage comprises high gate voltage, low gate voltage, common voltage, a first operating voltage, or second operating voltage.

11. A test method for a liquid crystal display control board, wherein the test method comprises the following steps:

receiving an output voltage from a liquid crystal display control board;

operating a conversion circuit that is connected to a reference voltage and receives the output voltage for converting the output voltage into an operating voltage for an indication unit and supplying the operating voltage to the indication unit, wherein the conversion circuit comprises a first resistor component and a second resistor component connected in series between the terminal and the reference voltage and the indication unit has a first end directly connected to a node point between the first and second resistor components and a second end connected directly to the terminal or the reference voltage and is connected in parallel with the first resistor component or the second resistor component, which defines a division voltage that is supplied to the indication unit, whereby the indication unit is activated when the division voltage corresponds to the operating voltage of the indication unit; and monitoring an operation condition of the liquid crystal display control board with the indication unit.

12. The test method as claimed in claim 11, wherein the step of operating a conversion circuit that is connected to a reference voltage and receives the output voltage for converting the output voltage into an operating voltage for an indication unit and supplying the operating voltage to the indication unit comprises:

performing filtration of the output voltage with a capacitor connected in parallel with the conversion circuit.

* * * * *